US006724628B2

(12) United States Patent
Franz et al.

(10) Patent No.: US 6,724,628 B2
(45) Date of Patent: Apr. 20, 2004

(54) BLINDMATE HEAT SINK ASSEMBLY

(75) Inventors: John P. Franz, Houston, TX (US); Wade David Vinson, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 137 days.

(21) Appl. No.: 10/036,165

(22) Filed: Dec. 26, 2001

(65) Prior Publication Data

US 2003/0117777 A1 Jun. 26, 2003

(51) Int. Cl.[7] .................................................. H05K 7/20
(52) U.S. Cl. .................... 361/704; 361/702; 361/707; 361/709; 257/718; 257/727; 174/16.3; 165/80.3
(58) Field of Search ................................. 361/697, 702, 361/703, 704, 707, 709, 718, 719; 257/706, 718, 719, 722, 727; 174/16.1, 16.3; 165/80.3, 185

(56) References Cited

U.S. PATENT DOCUMENTS

| 5,579,205 | A | * | 11/1996 | Tustaniwskyj et al. | ..... 361/704 |
|---|---|---|---|---|---|
| 6,084,178 | A | * | 7/2000 | Cromwell | .................. 174/35 R |
| 6,151,217 | A | * | 11/2000 | Thomsen | ..................... 361/709 |
| 6,373,701 | B1 | * | 4/2002 | Lo | .............................. 361/704 |
| 6,396,698 | B1 | * | 5/2002 | Holcombe | .................. 361/704 |
| 6,449,162 | B1 | * | 9/2002 | Corbin et al. | ................ 361/719 |
| 6,529,378 | B2 | * | 3/2003 | Wong et al. | ................. 361/704 |
| 6,560,112 | B1 | * | 5/2003 | Szu et al. | .................... 361/719 |

* cited by examiner

*Primary Examiner*—Boris Chervinsky

(57) ABSTRACT

A heat sink and processor assembly that can be easily installed and uninstalled from a circuit board without tools. One preferred embodiment of the heat sink assembly comprises a heat sink component, an alignment cage attached to the base of the heat sink and having an attachment point for releasably attaching a processor. The heat sink assembly further comprises a plurality of alignment pins and alignment tabs that are affixed to the base of the heat sink and interface with a specially designed socket and circuit board so as to align the mating components. The processor chip is installed onto the heat sink and then the combined assembly is installed onto a circuit board mounted socket. The alignment mechanisms provide a method for installing a processor without using tools or having to manually align the processor pins to the socket receptacles.

24 Claims, 4 Drawing Sheets

BLINDMATE HEAT SINK ASSEMBLY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to methods and apparatus for installing heat sinks and processors to a circuit board. More particularly, the present invention relates to methods and apparatus for attaching a processor to a heat sink to form an assembly that can then be attached to a circuit board without any tools or risk of damage to the processor.

2. Background of the Invention

Conventionally, a processor is mounted in a socket on a printed circuit board that includes a plurality of integrated circuits secured thereto. Heat dissipation affects the operation of the processor and thus it is desirable to have a highly effective heat sink for the processor. These types of heat sinks are often attached to the processor by way of a thermal interface, which serves to attach the heat sink to the processor and provide a path for thermal energy. In high power processor applications, the heat sink required for a given processor may have a much larger footprint than the processor itself.

The processor is first installed into a socket on the circuit board and retained in place by a lock mechanism that is often integral to the socket. Most processors are installed onto a socket by hand and it is up to the installer to ensure proper alignment of the processor pins with the holes on the socket. Because the pins on a processor are often very small and fragile, it is not uncommon to damage one or more pins during installation. If the pins of the processor are damaged they must be repaired and the processor will likely have to be replaced.

Once the processor is installed, the heat sink is then affixed to the top of the processor by the thermal interface material. The size of the heat sink may be large enough to prevent unlocking and removing of the processor while the heat sink is installed. Therefore, the heat sink must be removed from the processor before the processor can be removed from the socket. There exists no method or apparatus in the prior art to easily separate the heat sink from the processor once the thermal interface has been heated. Often this removal is performed using brute force, often resulting in damage to the processor during the removal process.

Therefore, there remains a need in the art for methods and apparatus that allow for processors and heat sinks to be installed and uninstalled from a circuit board without risking damage to the processor. It is also desirable to have a processor and heat sink assembly that can be installed and uninstalled without tools and without relying on the steady hand of a technician to prevent damage to the processor chip. The preferred embodiments of the present invention described below overcome these and other deficiencies of the prior art while focusing on these needs.

BRIEF SUMMARY OF THE PREFERRED EMBODIMENTS OF THE INVENTION

The preferred embodiments of the present invention overcome the deficiencies of the prior art noted above, by providing a heat sink processor assembly that can be easily installed and uninstalled from a circuit board configured to accept the assembly. Accordingly, one preferred embodiment of the heat sink assembly comprises a heat sink component and an alignment cage that is attached to the base of the heat sink. The heat sink assembly further comprises a plurality of alignment pins affixed to the base of the heat sink that align to features built into the circuit board. The alignment cage further comprises an attachment point for releasably attaching a processor with sufficient strength to maintain contact between the processor and the heat sink but also allowing the processor to "float" in order to properly interface with mating holes on a socket, given all the tolerance variations possible in the system. The alignment cage comprises features that, along with the pins on the processor, interface with a specially designed socket to properly align and seat the processor chip. Thus, the processor, heat sink assembly, and socket all comprise features that work together to allow easy engagement and disengagement of the processor without tools and without having to pry the heat sink from the processor.

Once the processor is attached to the alignment cage, the heat sink assembly is prepared for installation onto the circuit board. The circuit board has a plurality of holes arranged to accept the alignment pins. Inserting the alignment pins into the chamfered holes on the circuit board provides a rough alignment of the processor to a socket also mounted to the circuit board. As the alignment pins are inserted into the holes, the alignment cage interacts with the socket providing an intermediate alignment between the processor and the socket. The intermediate alignment provides an alignment that is within the tolerances that allow the inherent alignment features of the processor and the socket to provide the final alignment of the processor pins with the chamfered receiving holes on the socket. Once the processor is fully engaged with the socket, the processor is electrically coupled to the socket by actuating a socket locking lever that is extended beyond the heat sink volume. The heat sink and socket assembly can be uninstalled by reversing this procedure.

Accordingly, this particular embodiment of the present invention provides a heat sink and processor assembly that can be installed onto a circuit board with a socket that comprises unique features that allow for installation the neither requires tools nor damages the processor. Therefore, the embodiments of the present invention provide a heat sink/processor assembly and circuit board and socket arrangement that decrease the difficulty and costs of installing and maintaining heat sinks and processors.

BRIEF DESCRIPTION OF THE DRAWINGS

For a detailed description of the preferred embodiments of the invention, reference will now be made to the accompanying drawings in which.

NOTATION AND NOMENCLATURE

Figure 1:
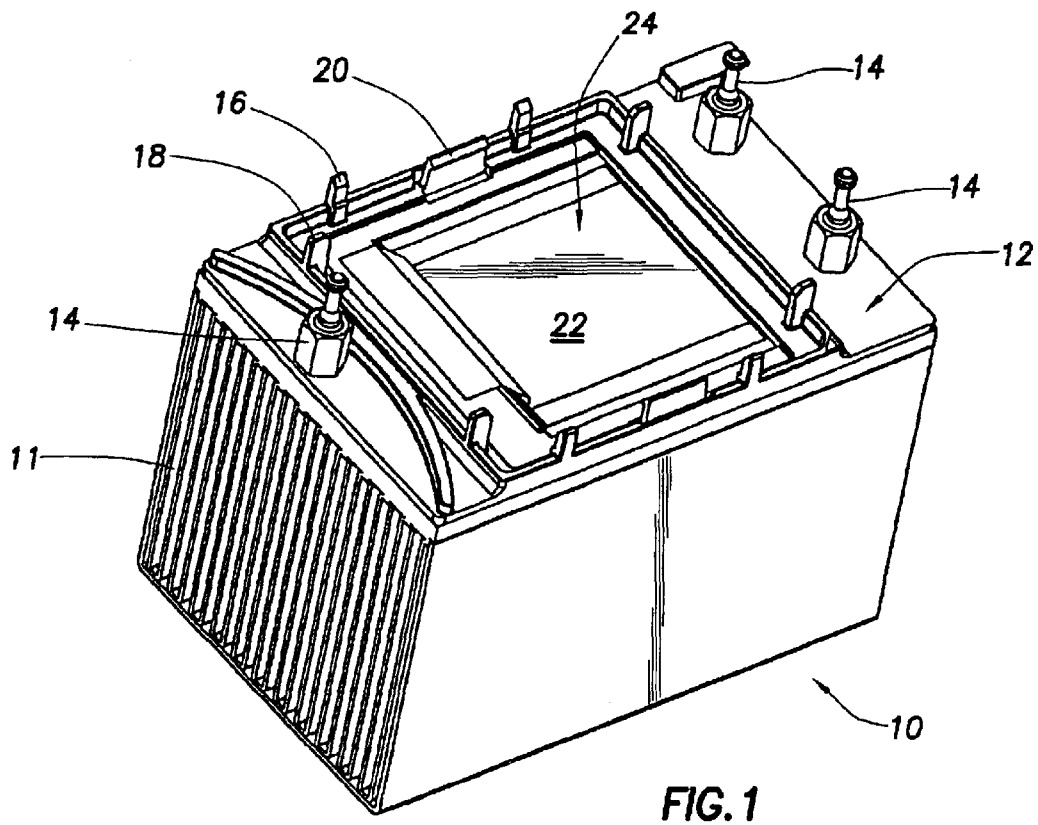
FIG. 1 is an isometric view of one embodiment of the heat sink assembly without a processor installed.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Assembly is used to define the assembly of a heat sink and a processor chip. Board is used to refer to an integrated circuit board.

In the description that follows, like parts are marked throughout the specification and drawings with the same reference numerals, respectively. The drawing figures are not necessarily to scale. Certain features of the invention may be shown exaggerated in scale or in somewhat schematic form and some details of conventional elements may not be shown in the interest of clarity and conciseness.

In order to fully describe the preferred embodiments of the present invention, reference will be made throughout this description to a heat sink and processor assembly that shows a typical 603 pin processor chip, but the concepts described herein are applicable to other types of computers and integrated circuit chips, as well as non-computer applications. Embodiments of the present invention may find particular use with integrated circuit chips other than processors as well as other components that interface by way of a multi-pin connection. The present invention is susceptible to embodiments of different forms. There are shown in the drawings, and herein will be described in detail, specific embodiments of the present invention with the understanding that the present disclosure is to be considered an exemplification of the principles of the invention, and is not intended to limit the invention to that illustrated and described herein.

DETAILED DESCRIPTION OF THE PREFERRED EMBODIMENTS

Figure 2:
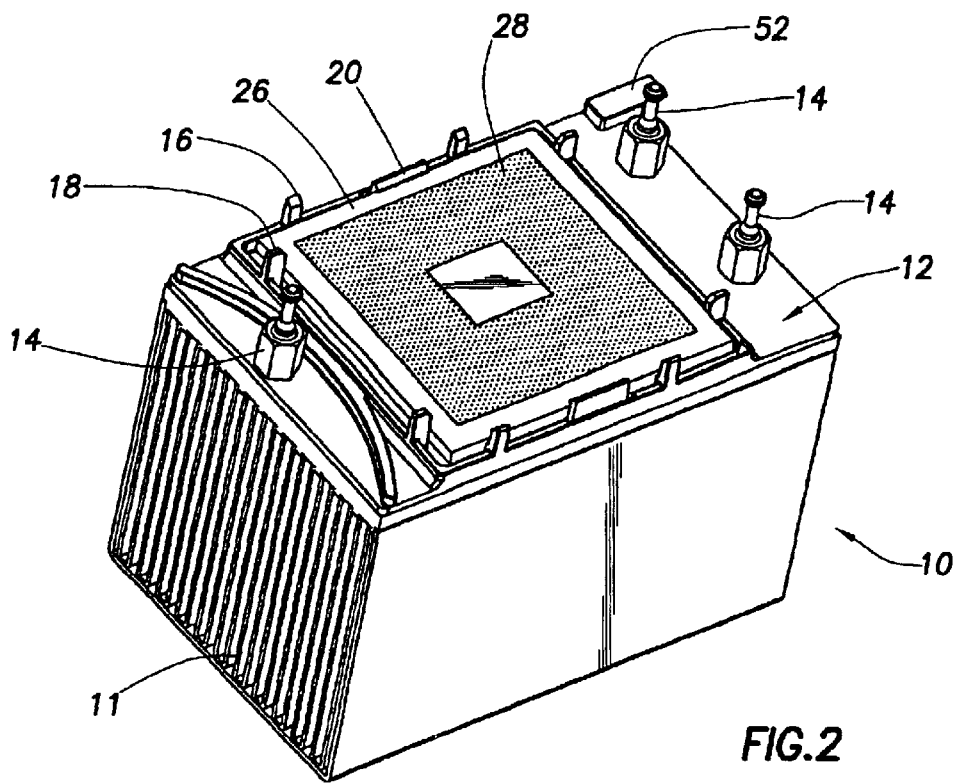
FIG. 2 is an isometric view of one embodiment of the heat sink assembly with a processor installed.

Referring now to FIGS. 1 and 2, a heat sink assembly 10, constructed in accordance with the preferred embodiment, comprises an alignment cage 12, and a plurality of alignment pins 14 attached to a heat sink 10. The alignment cage 12 comprises a plurality of locating tabs 16, 18 that surround a receptacle 24 sized to receive a processor chip 26. As shown in FIG. 2, receptacle 24 comprises a pair of clips 20, or some other mechanism for retaining the processor chip 26 in place. As best seen in FIG. 1, receptacle 24 is preferably adapted to receive a thermal interface film 22 to enhance the thermal connection between the processor chip 26 and the heat sink 11. Processor chip 26 is installed with pins 28 facing away from the heat sink 11 and once installed is ready for installation onto a circuit board.

Figure 4:
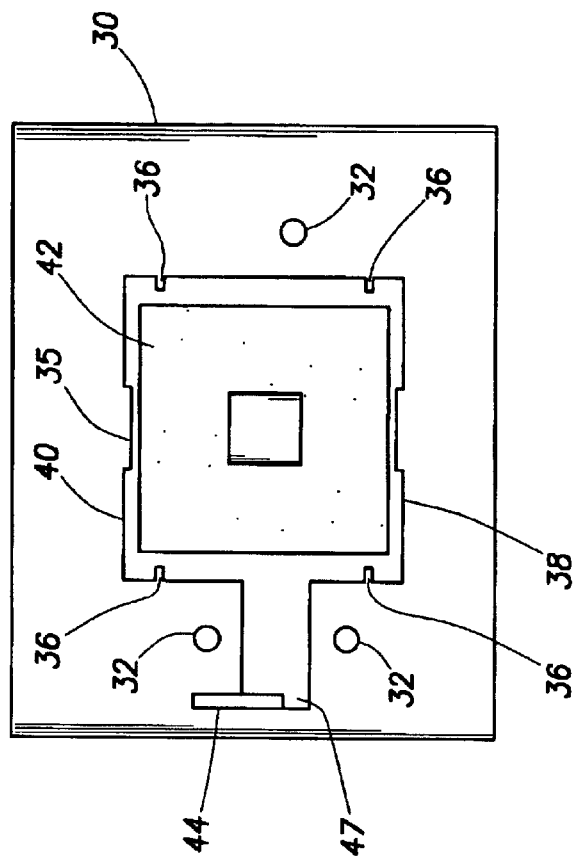
FIG. 4 is a plan view of one embodiment of a socket installed on a circuit board.
Figure 3:
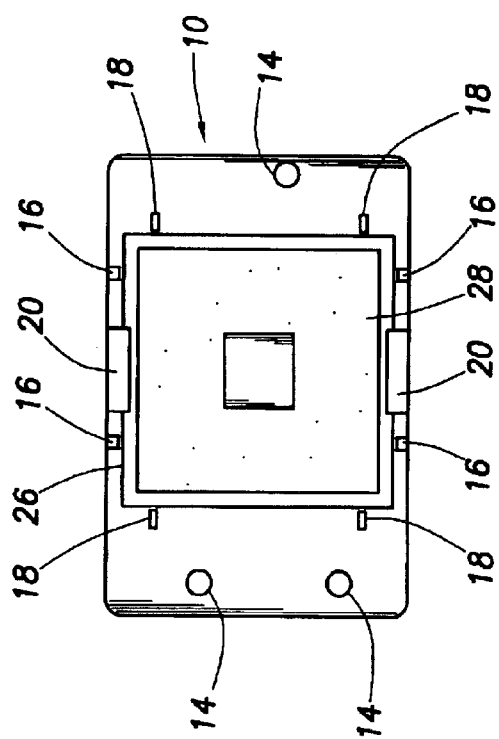
FIG. 3 is a plan view of one embodiment of an alignment cage and alignment pins.

FIG. 3 and FIG. 4 depict, respectively, schematic representations of the interfacing portions of heat sink assembly 10 with a processor 26 installed and the corresponding interfacing portions of circuit board 30 and chip socket 34. Circuit board 30 has a plurality of holes 32 that are sized and spaced to accommodate alignment pins 14. Alignment pins 14 entering holes 32 serves as the initial gross alignment of the processor chip 26 and the socket 34. As the heat sink assembly 10 is lowered, locating tabs 18 interface with corresponding slots 36 integrally constructed into socket 34 and tabs 16 are spaced so as to fit along edges 38, 40 of socket 34. The interaction of locating tabs 16,18 and the socket 34 ensures that processor pins 28 will enter the corresponding receptacles 42 built into socket 34. In addition, clips 20 have clearance slots 35 built into socket 34. Once processor 26 is fully engaged into socket 34, locking lever 44 is actuated, which locks the processor in place and couples the processor to the circuit board. Locking lever 44 located at the end of an extended arm 47 so that it can be accessed when the heat sink assembly 10 is installed.

Figure 5:
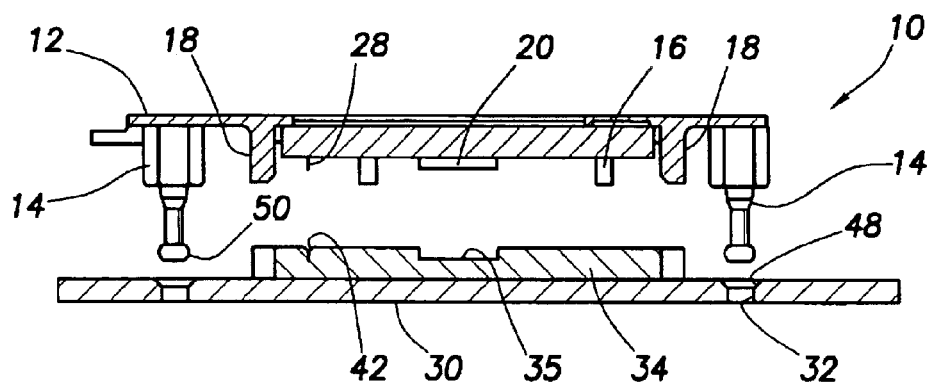
FIG. 5 is a schematic elevation view of a heat sink assembly interfacing with a socket and circuit board in a first position.

FIGS. 5–8 depict the sequence of events that occur as assembly 10 is installed onto circuit board 30. FIG. 5 shows assembly 10 positioned just prior to engaging circuit board 30. Alignment pins 14 are positioned by the used to align with holes 32 located on circuit board 30. Holes 32 preferably have a chamfered opening 48 that, along with chamfered head 50 of pin 14, directs each pin 14 into its corresponding hole 32. Assembly 10 preferably comprises at least two alignment pins 14 to positively locate the assembly 10 on the circuit board 30. It is also preferred that the alignment pins 14 are arranged so that the assembly 10 can only be installed in one position relative to board 30. This is preferably accomplished by using three alignment pins 14, which allow assembly 10 to be installed in only one position and provide a stable base for the assembly 10.

Figure 6:
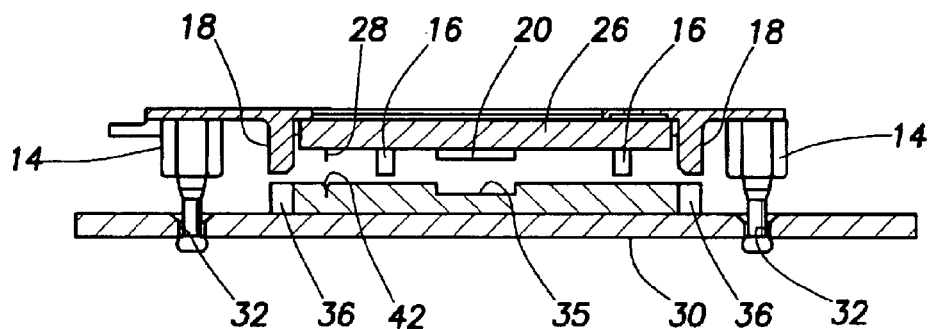
FIG. 6 is a schematic elevation view of a heat sink assembly interfacing with a socket and circuit board in a second position.

FIG. 6 depicts assembly 10 as it is aligned with board 30 and as the alignment cage 12 begins to interface with socket 34. Alignment tabs 18 fit into slots 36 on socket 34 to position assembly 10 in one direction, while positioning in the perpendicular direction is controlled by alignment tabs 16 contacting the outside edges of socket 34. Alignment tabs 16,18 work to refine the alignment of assembly 10 to socket 34 and place the processor 26 in position to properly engage the socket. Cage 12, by way of clips 20, retains the processor 26 but preferably provides the compliance to allow the processor to easily interface with socket 34. It is preferred that the alignment tabs 16,18 serve to further refine the alignment of processor 26 with socket 34 to a position to enable the processor pins 28 to easily engage receptacles 42 without damaging the pins.

Figure 7:
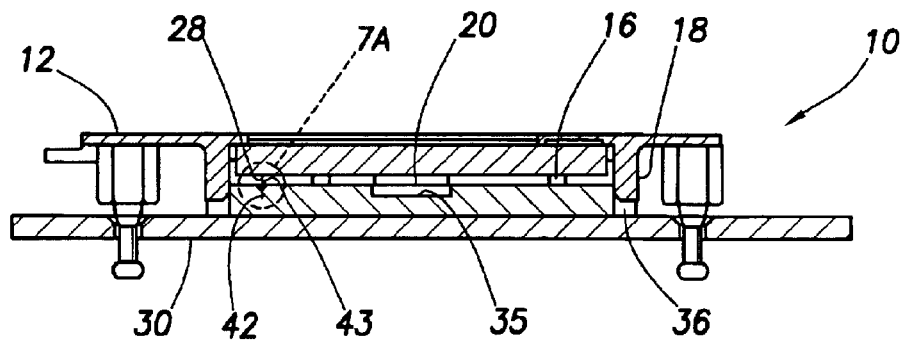
FIG. 7 is a schematic elevation view of a heat sink assembly interfacing with a socket and circuit board in a third position.
Figure 7A:
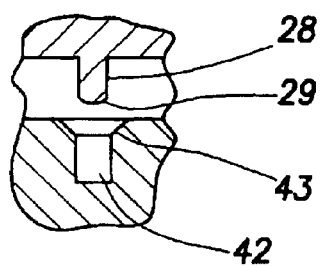
FIG. 7A is a schematic elevation view of the a processor pin interfacing with a receptacle on the socket.
Figure 8:
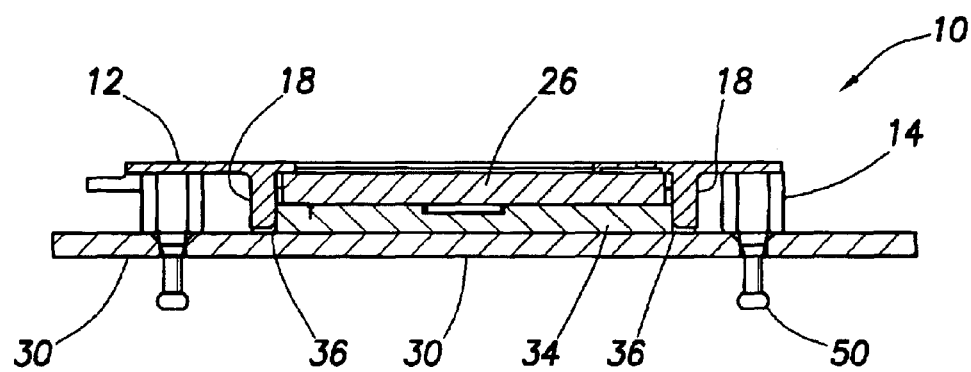
FIG. 8 is a schematic elevation view of a heat sink assembly interfacing with a socket and circuit board in a fully engaged position.

FIG. 7 and FIG. 7A show the assembly 10 as processor pins 28 are aligning with mounting holes 42. Each mounting hole 42 has a chamfered entrance 43 that combined with the chamfered, or pointed, end 29 of pin 28 allows the pin to smoothly enter the mounting hole.

Figure 9:
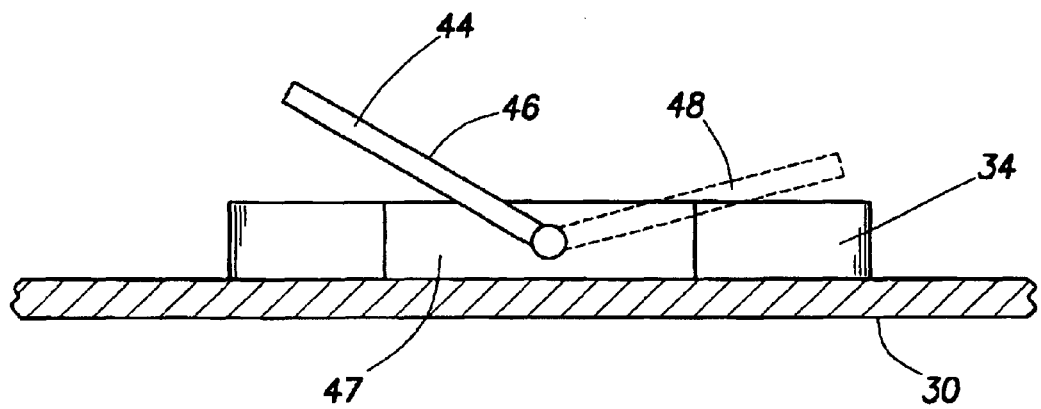
FIG. 9 is a side view of the socket.

FIG. 9 shows an end view of socket 34 with locking lever 44 shown in both an open position 46 and a closed position 48 (shown in phantom lines). In both open 46 and closed 48 positions, locking lever 44 is elevated above, and at an angle to, board 30. This provides clearance beneath locking lever 44 for other components to be mounted to board 30 and makes it easier for a user to manually actuate the lever. Referring back to FIG. 2, cage 12 preferably comprises a tab 52 located at one corner of the cage. The closed position 48 of locking lever 44 is arranged so as to interfere with tab 52 and prevent insertion of processor 26 into socket 34 if it is closed.

In an alternative embodiment, the position of the alignment pins and the holes may be reversed with the pins being mounted on the board and the holes being in the heat sink assembly. This arrangement may be used if there is limited access to the underside of the board. Other embodiments may include sockets that provide all alignment features necessary to seat the chip, therefore eliminating any alignment features on the board, or heat sink and processor assemblies that are used to install multiple chips simultaneously. It is also contemplated that there are many different arrangements of alignment pins and alignment tabs that will perform identical functions to the embodiments described above.

It is preferred that the heat sink and the alignment pins be constructed of metal. The alignment cage and socket are preferably constructed from a thermoplastic material such as is common in computer components.

Therefore the preferred embodiments of the present invention described above provide a method and apparatus for simultaneously installing a processor chip and a heat sink to a circuit board without needing any tools. The embodiments of the present invention provide apparatus that ensure the proper engagement of the processor chip to a socket, therefore preventing any damage to the chip during the installation sequence. The above described embodiments also provide an apparatus that limits the installation errors that can be made by a user by providing parts that only interface in one method and can not be installed improperly. Therefore, the embodiments of the present invention decrease the costs of installing and maintaining high performance processor chips that require very large heat sinks.

The above discussion is meant to be illustrative of the principles and various embodiments of the present invention. Numerous variations and modifications will become apparent to those skilled in the art once the above disclosure is fully appreciated. For example, a rail designed in accordance with the present invention could be used in a non-computer environment as a drawer slide or other such device. It is intended that the following claims be interpreted to embrace all such variations and modifications.

What is claimed is:

1. A socket for receiving an electronic device having connector pins and alignment tabs, said socket comprising:
   an upper surface;
   a plurality of receptacles in said upper surface for receiving the connector pins;
   a plurality of apertures in said upper surface for receiving the alignment tabs, wherein said apertures are arranged so as to align the connector pins and said receptacles as the apertures receive the alignment tabs;
   an arm extending from the socket; and
   a locking lever pivotally connected to said arm, wherein said locking lever has a first position wherein the electronic device is locked to the socket and a second position wherein the electronic device can be removed from the socket.

2. The socket of claim 1 wherein said locking lever is elevated above said upper surface in both the first and second positions.

3. The socket of claim 1 wherein the electronic device includes at least one tab arranged so as to prevent engagement of the electronic device and said socket when said locking lever is in the first position.

4. The socket of claim 1 wherein said apertures are arranged around the perimeter of said upper surface.

5. The socket of claim 1 wherein the electronic device includes a heat sink having a larger footprint that said socket and said locking lever can be actuated when the electronic device and heat sink are engaged with said socket.

6. The socket of claim 1 wherein said receptacles are arranged in a grid array for receiving the connector pins arranged in a corresponding grid array.

7. An assembly comprising:
   a circuit board;
   a socket connected to said circuit board and comprising an upper surface having a plurality of receptacles;
   an electronic device having a plurality of connector pins disposed in the receptacles of said socket;
   an alignment cage connected to said electronic device and having a plurality of alignment tabs arranged to interface with said socket to align the connector pins with the receptacles;
   a heat sink attached to said alignment cage and in thermal contact with said electronic device, wherein said heat sink has a footprint extending beyond both said electronic device and said socket;
   a plurality of alignment pins protruding from said heat sink and arranged to interface with a corresponding number of holes in said circuit board so as to align the alignment tabs with said socket;
   a locking lever pivotally connected to an arm extending from said socket to a position outside of the footprint of said heat sink.

8. The assembly of claim 7 wherein said locking lever has a first position wherein the electronic device is locked to the socket and a second position wherein the electronic device can be removed from the socket; wherein both said locking lever is at an angle to said circuit board in both the first and second positions.

9. The assembly of claim 8 further comprising a tab that prevents engagement of said electronic device and said socket when said locking lever is in the first position.

10. The assembly of claim 7 wherein said socket further comprises a plurality of apertures arranged to interface with the alignment tabs of said alignment cage.

11. The assembly of claim 7 wherein said alignment pins extend past the alignment tabs of said alignment cage and the alignment tabs extend past the connector pins of said electronic device.

12. A method for installing a chip and heat sink assembly to a socket mounted on a circuit board, the method comprising:
   attaching the chip to an alignment cage disposed on the heat sink assembly;
   inserting alignment pins protruding from the heat sink assembly into holes in the circuit board;
   moving the heat sink assembly toward the circuit board to first engage the alignment cage and the socket and then engage the chip and the socket; and
   actuating a locking lever to lock the chip to the socket, wherein the locking lever is mounted to an arm extending from the socket.

13. The method of claim 12 wherein observation of the engagement of the alignment cage and the chip with the socket is obscured by the heat sink.

14. The method of claim 12 wherein the alignment cage has a plurality of tabs arranged so as to interface with a plurality of apertures in the socket in order to align the chip and the socket before pins protruding from the chip engage receptacles on the socket.

15. A computer system comprising:
   a circuit board;
   a socket mounted to said circuit board;
   a electronic device having pins engaged with receptacles on said socket;

a cage attached to said electronic device and engaged with said socket;

a heat sink connected to said cage and in thermal contact with said electronic device, wherein said heat sink has a perimeter that extends beyond said socket;

means for aligning said heat sink with said circuit board;

means for aligning said cage and said socket;

means for aligning the pins of said electronic device with and the receptacles of said socket; and a locking lever rotatably mounted to an arm extending from said socket.

16. The system of claim 15 wherein said means for aligning said heat sink with said circuit board provides gross alignment between said cage and said socket.

17. The system of claim 16 wherein said means for aligning said cage and said socket provides alignment between said electronic device and said socket.

18. The system of claim 15 wherein said means for aligning the pins of said electronic device with and the receptacles of said socket is not engaged until said means for aligning said cage and said socket is engaged.

19. The system of claim 18 wherein means for aligning said cage and said socket is not engaged until said means for aligning said heat sink with said circuit board is engaged.

20. The system of claim 15 wherein said locking lever has a locked position securing said electronic device to said socket and an unlocked position allowing said electronic device to be moved relative to said socket.

21. The system of claim 20 wherein said locking lever is elevated above said circuit board in both the locked and unlocked position.

22. The system of claim 15 wherein said locking lever extends from said socket to a position not under said heat sink.

23. The system of claim 15 wherein the pins of said electronic device are arranged in a grid array.

24. The system of claim 23 wherein the receptacles on said socket are arranged in a corresponding grid array operable to receive the pins of said electronic device.

* * * * *